(12) United States Patent
Kim et al.

(10) Patent No.: US 10,325,859 B1
(45) Date of Patent: Jun. 18, 2019

(54) SHIELDED STACKED SUBSTRATE APPARATUS AND METHOD OF FABRICATING

(71) Applicant: QUALCOMM Incorporated, San Diego, CA (US)

(72) Inventors: Daeik Kim, Del Mar, CA (US); Jie Fu, Sunnyvale, CA (US); Manuel Aldrete, Encinitas, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/944,233

(22) Filed: Apr. 3, 2018

(51) Int. Cl.
*H01L 23/538* (2006.01)
*H01L 23/552* (2006.01)
*H01L 25/16* (2006.01)

(52) U.S. Cl.
CPC ........ *H01L 23/552* (2013.01); *H01L 23/5385* (2013.01); *H01L 23/5386* (2013.01); *H01L 25/162* (2013.01); *H01L 25/165* (2013.01)

(58) Field of Classification Search
CPC ............... H01L 23/552; H01L 23/5385; H01L 23/5386
See application file for complete search history.

(56) References Cited

U.S. PATENT DOCUMENTS

2013/0328177 A1* 12/2013 Cho ...................... H01L 21/565
257/659

* cited by examiner

*Primary Examiner* — Elias Ullah
(74) *Attorney, Agent, or Firm* — Qualcomm Incorporated

(57) ABSTRACT

Some features pertain to a stacked package apparatus that includes a shield at least partially surrounding the apparatus, a first substrate including a plurality of first pads, the plurality of first pads coupled to the shield, and a second substrate, the second substrate over the first substrate and coupled to the first substrate, the second substrate including a plurality of second pads, the plurality of second pads coupled to the shield.

13 Claims, 11 Drawing Sheets

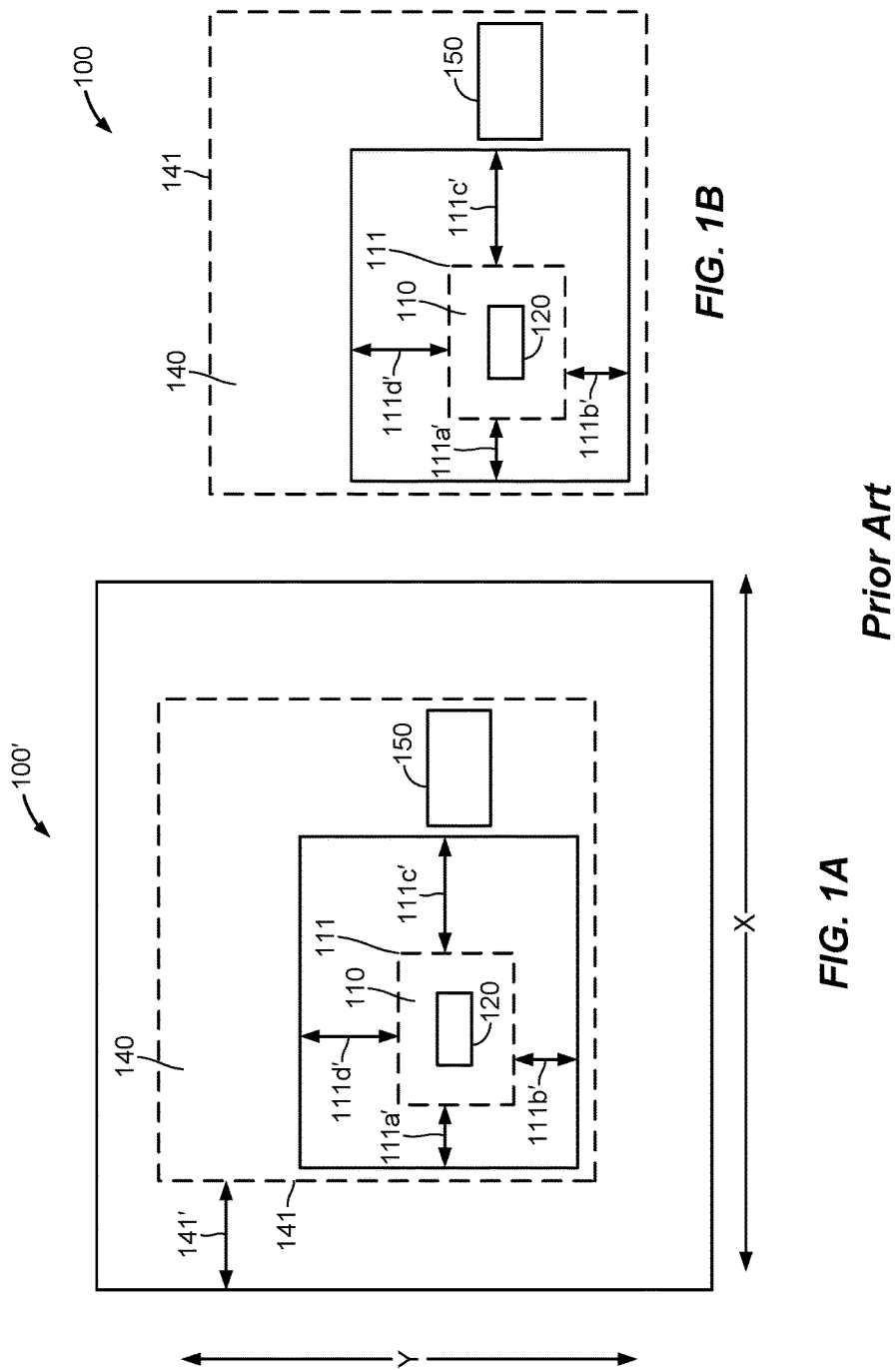

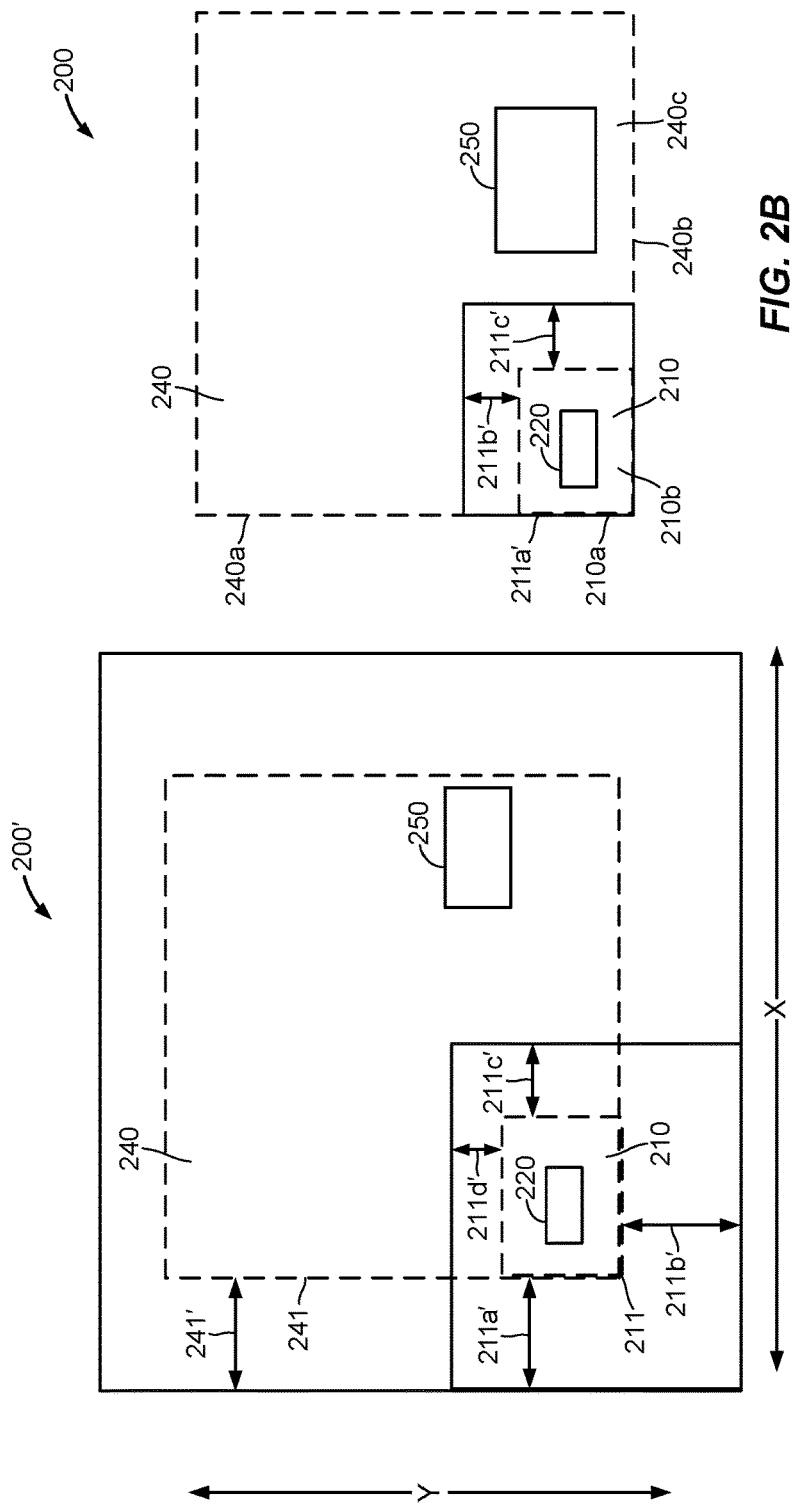

Cross-Section View

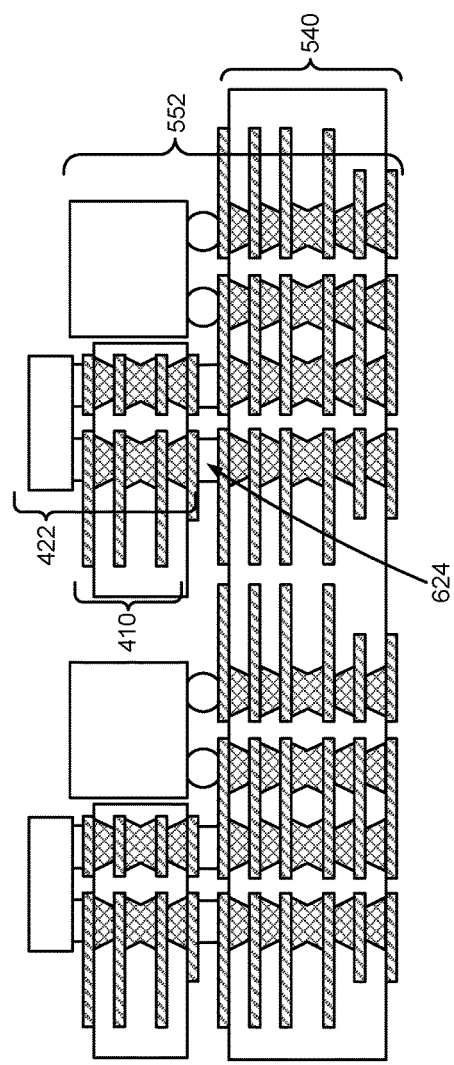
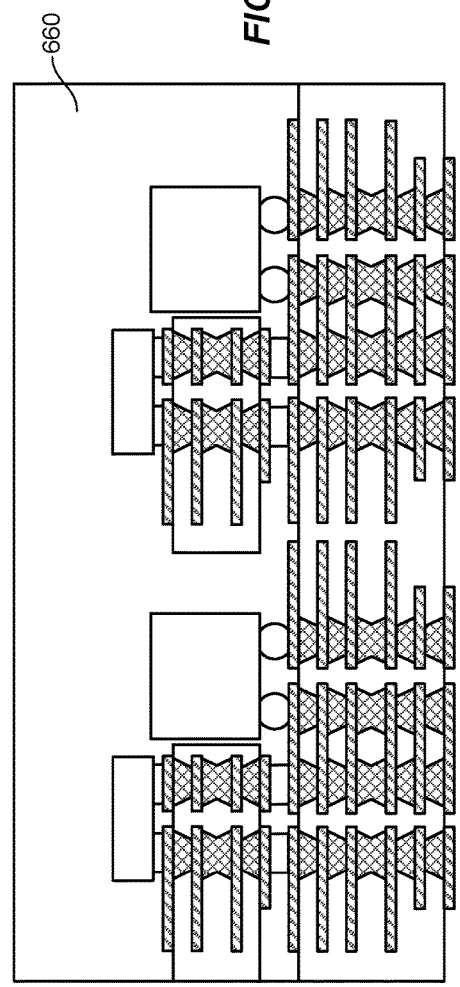

SHIELDED STACKED SUBSTRATE APPARATUS AND METHOD OF FABRICATING

BACKGROUND

Field of the Disclosure

Various features relate to shielded, stacked substrates.

Background

Integrated circuits, substrates, packages and electronic devices are being continually driven to smaller form factors. Such integrated circuits, packages and electronic devices requires strong shielding to protect and to isolate against electromagnetic interference. Moreover, industry needs change quickly and there is a need to be able to add or change the functionality of a main package with the use of a module package.

As the form factor of electronic devices is reduced, challenges exist in maintaining a small substrate. As will be discussed, the module package is stacked over the main module package and therefore requires a significant amount of area of the substrate.

FIG. 1A illustrates a simplified top view of a stacked substrate apparatus 100' prior to singulation. Specifically, FIG. 1A illustrates a first substrate 140 and a second substrate 110 coupled to devices 120 and 150 respectively. The second substrate 110 is stacked over the first substrate 140. The second substrate 110 is placed over a corner of the first substrate 140 and located within a first keep out boundary 141 of the first substrate 140.

The first substrate 140 includes the first keep out boundary 141 and a corresponding first keep out region 141' (prior to singulation). The second substrate 110 includes a second keep out boundary 111 and a corresponding second keep out region 111' including 111a', 111b', 111c' and 111d' (prior to singulation). The first keep out region 141' and the second keep out region 111' are a reserved space where circuits may not be placed. During fabrication of the stacked substrate apparatus 100, singulation is performed and the first keep out region 141' and the second keep out region 111' serve to avoid damage of circuits during the fabrication. Furthermore, the first keep out region 141' and the second keep out region 111' serve to minimize electromagnetic interference to or from any IC or passive device on the first substrate 140 or on the second substrate 110.

The second keep out region 111' is located around a periphery of the second substrate 110. The second keep out region 111a' includes a length in an x axis and the second keep out region 111b' includes a length in a y axis.

It shall be noted that the first substrate 140 must be large enough not only to accommodate the device 150 that it is coupled to, but it must also be large enough to accommodate its first keep out region 141' and the second keep out region 111' of the first substrate 110. This makes it challenging to shrink the size of the stacked substrate apparatus 100.

FIG. 1B illustrates a top view of the stacked substrate apparatus 100 of FIG. 1A after singulation. The singulation is performed at the first keep out boundary 141. It can be seen that after singulation, the stacked substrate apparatus 100 still includes the second keep out regions 111a' and 111b' (as well as 111c' and 111d').

FIG. 1C illustrates a cross-section of FIG. 1B. It shall be understood that FIG. 1C is shown after singulation is performed at the first keep out boundary 141. Specifically, FIG. 1C illustrates the stacked substrate apparatus 100 (after singulation) including: a main package 152 including the device 150 coupled to the first substrate 140, a modular package 122 including the device 120 coupled to the second substrate 110. The modular package 122 is coupled to the main package 152. The stacked substrate apparatus 100 also includes a mold 160 and a shield 162.

A plurality of first pads 142 of the first substrate 140 are exposed (after singulation) and coupled to the shield 162. The shield 162 may also serve as ground. However, the modular package 122 is not coupled to the shield 162 and therefore does not have its own ground connection. Prior to singulation (see FIG. 1B), the second substrate 110 including its second keep out region 111' was placed within the first keep out region 141' of the first substrate prior to singulation. Therefore, even after singulation (see FIG. 1C), the modular package 122 is not flush with the shield 162, i.e., the second keep out region 111a' and 111b' remain and are not coupled to the shield 162. Accordingly, the first substrate 140 must be separately grounded.

FIG. 1C illustrates how the second keep out boundary length 111a' and 111b' (FIG. 1B for 111b') requires the first substrate 140 to be larger to accommodate the extra space 111a' and 111b'.

Accordingly, there is need in the industry for a shielded, stacked substrate apparatus with a small form factor, with a stronger coupling to ground.

SUMMARY

Various features relate to shielded, stacked substrates.

A first example provides an apparatus that includes a shield at least partially surrounding the apparatus, a first substrate including a first plurality of pads, the plurality of first pads coupled to the shield, and a second substrate, the second substrate over the first substrate and coupled to the first substrate, the second substrate including a plurality of second pads, the plurality of second pads coupled to the shield.

A second example provides a method of fabricating a stacked package, including forming a first substrate, including forming a plurality of first pads, forming a second substrate, including forming a plurality of second pads, coupling the second substrate to the first substrate, wherein the second substrate is over the first substrate; and forming a shield at least partially surrounding the package, wherein the plurality of first pads are coupled to the shield and the plurality of second pads are coupled to the shield.

DRAWINGS

Various features, nature and advantages may become apparent from the detailed description set forth below when taken in conjunction with the drawings in which like reference characters identify correspondingly throughout.

FIG. 1A illustrates a top view of a conventional stacked substrate apparatus prior to singulation.

FIG. 1B illustrates a top view of the conventional stacked substrate apparatus of FIG. 1A after singulation of the prior art.

FIG. 2A illustrates a top view of a stacked substrate apparatus prior to singulation.

FIG. 2B illustrates a top view of the stacked substrate apparatus of FIG. 2A after singulation.

DETAILED DESCRIPTION

Figure 1C:
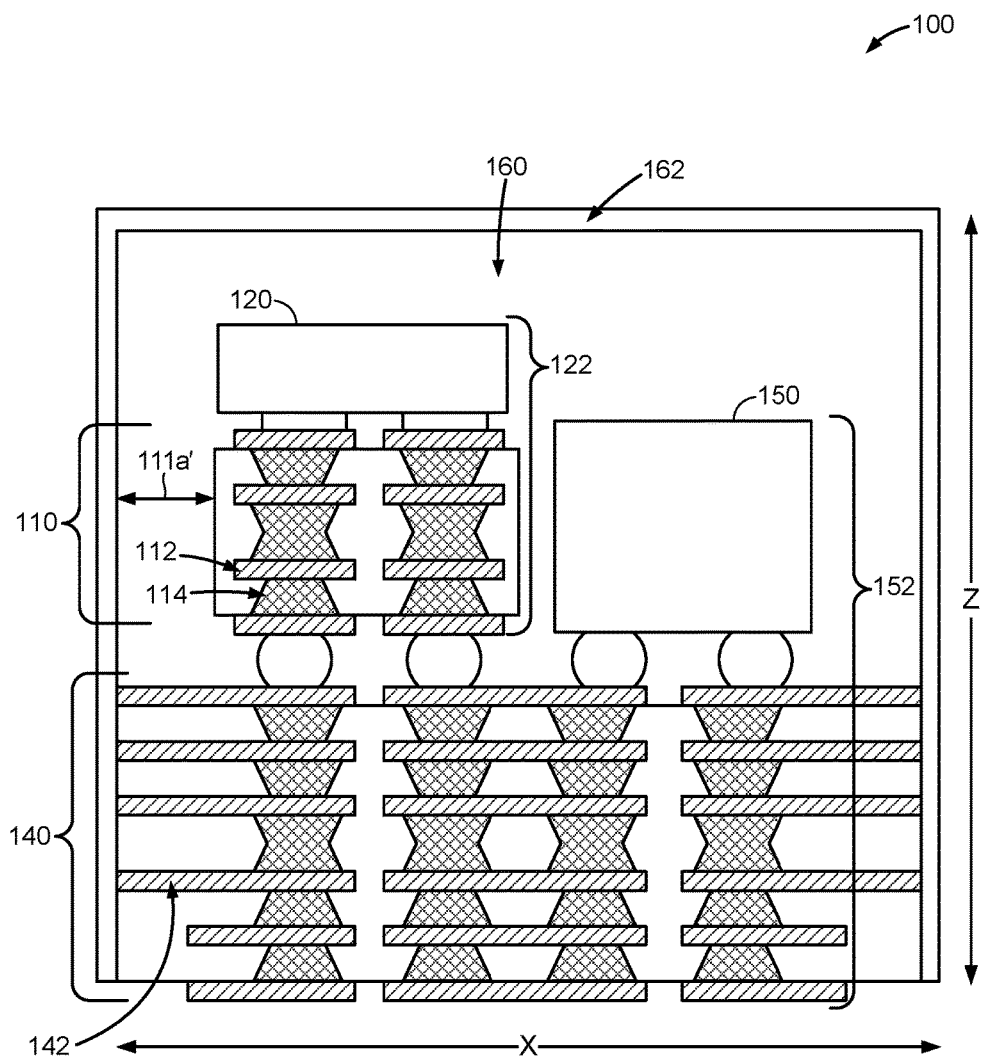
FIG. 1C illustrates a cross-section of FIG. 1B.

In the following description, specific details are given to provide a thorough understanding of the various aspects of the disclosure. However, it will be understood by one of ordinary skill in the art that the aspects may be practiced without these specific details. For example, circuits may be shown in block diagrams to avoid obscuring the aspects in unnecessary detail. In other instances, well-known circuits, structures and techniques may not be shown in detail in order not to obscure the aspects of the disclosure.

Overview

Some features pertain to a stacked package apparatus including a modular package coupled over, and to the main package. The stacked package apparatus is molded and at least partially surrounded by a shield. The main package includes a device and a first substrate. The first substrate includes a plurality of first pads, a plurality of first vias, and a plurality of first dielectric layers. The plurality of first pads are coupled to the shield. The shield may be grounded.

The modular package includes a device and a second substrate. The second substrate includes a plurality of second pads, a plurality of second vias, and a plurality of second dielectric layers.

The first substrate includes a first keep out boundary, that corresponds to a first keep out region (e.g., a reserved area where other devices may not be placed). The second substrate includes a second keep out boundary that corresponds to a second keep out region. All remaining space on the first substrate and the second substrate, other than the first and the second keep out regions, are useful space where circuits or other devices may be placed.

Prior to singulation, the second keep out boundary of the second substrate is substantially aligned with a first keep out boundary of the first substrate. Furthermore, a first side and a second side of the second substrate are substantially aligned with a first side and a second side of the first substrate, respectively. Aligning the second substrate to the first substrate in this manner, utilizes less of the useful space of the first substrate. Therefore, the first substrate may either be reduced in size, or may be kept the same size so that additional devices may be coupled to the first substrate. Moreover, substantially aligning the second substrate to the first substrate in this manner also allows the modular package to be grounded by way of the grounded shield. The modular package is coupled to the grounded shield by way of the plurality of second pads.

Exemplary Shielded, Stacked Substrates

FIG. 2A illustrates a simplified top-view of a stacked substrate apparatus 200' prior to singulation. For simplicity, some elements are not shown such as a plurality of first pads and second pads.

Specifically, FIG. 2A illustrates a first substrate 240 and a second substrate 210, the second substrate 210 stacked over and coupled to the first substrate 240. The first substrate 240 and the second substrate 210 may be coupled to devices 250 and 220 respectively.

The first substrate 240 includes a first keep out boundary 241 and a corresponding first keep out region 241'. The first keep out region 241' includes the area around the perimeter of the first substrate 240. The second substrate 210 has a second keep out boundary 211 and a corresponding second keep out region 211' including 211a', 211b', 211c' and 211d'. The second keep out region 211' is located around a periphery of the second substrate 210. The second keep out region 211a' includes a length in an x axis and the second keep out region 211b' includes a length in a y axis. The first keep out region 241' and the second keep out region 211' are a reserved space where circuits may not be placed. All remaining space on the first substrate 240 and the second substrate 210, other than the first keep out region 241' and the second keep out region 211', respectively, are useful space where circuits or other devices may be placed.

The second substrate 210 may be placed over any corner of the first substrate 240 or along any side of the first substrate 240. In a first aspect, the second substrate 210 is placed in the corner edges of the first substrate 240. In a second aspect, the second substrate 210 is placed proximate to or near the corner edges of the first substrate 240. In a third aspect that includes either the first or second aspect, the second keep out boundary 211 of the first substrate 210 is substantially aligned with the first keep out boundary 241 of the second substrate 240. Comparing FIG. 2A to FIG. 1A, it can be clearly seen that even before singulation, the second substrate 210 requires less useful space on the first substrate 240 as compared to FIG. 1A, resulting in more useful space for other circuits or other devices on the second substrate 210. This is because instead of the second substrate 210 being located within the second keep out boundary 241 (as in FIG. 1A—see second substrate 110 located within the second keep out boundary 141) and consuming useful space on the first substrate 240, the second substrate 210 is arranged so that its first keep out boundary 211 is substantially aligned with the second keep out boundary 241.

This arrangement of the second substrate 210 leaves much more useful space on the first substrate 240. The useful space on the first substrate 240 may be utilized to put additional devices (e.g., passive devices or integrated circuits), thus increasing the density without increasing the size. The first substrate 240 may be reduced in size, thereby achieving a smaller form factor.

FIG. 2B illustrates a top-view of the stacked substrate apparatus 200' after singulation. In particular, a cut is made around the entire periphery of the stacked substrate apparatus 200', specifically at the first keep out boundary 241. After singulation, it can be seen that the stacked substrate apparatus 200 is smaller than the stacked substrate apparatus 100 of FIG. 1B. The space savings corresponds to the length of the second keep out region 211a' in the x axis and to the length of the second keep out region 211b' in the y axis. That is, the second keep out regions 211a' and 211b are singulated or cut off/removed, thereby saving space in the x-axis and y-axis respectively. This is in contrast to FIG. 1B, where even after singulation, the entire second keep out region 111a' and 111b still remain on the first substrate 140. In FIG.

1B, even after singulation, the first substrate 140 must be large enough to accommodate the second substrate 110 and the second keep out region 111'.

Figure 2C:
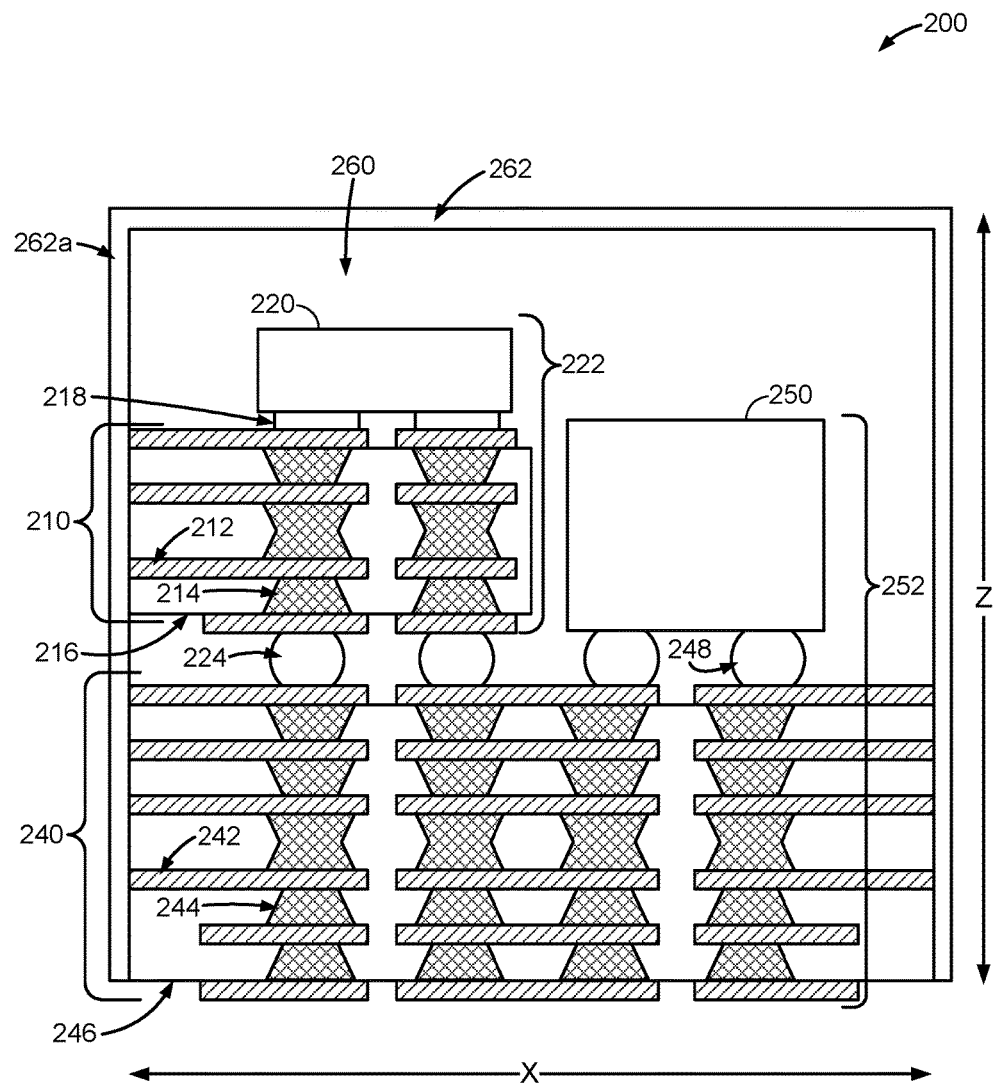
FIG. 2C illustrates a cross section of the stacked substrate apparatus of FIG. 2B.

FIG. 2C illustrates a cross section of the stacked substrate apparatus 200 of FIG. 2B. FIG. 2C is shown after singulation is performed at the first keep out boundary 241. FIG. 2C illustrates a modular package 222 stacked over, and coupled to a main package 252, a mold 260 over the modular package 222 and the main package 252, and a shield 260. The shield 260 may be coupled to ground. The shield at least partially surrounds the stacked substrate apparatus 200.

The main package 252 includes the device 250 coupled to the first substrate 240. The device 250 may be an integrated circuit (IC) or a passive device. The device 250 is coupled to the first substrate 240 through a plurality of first interconnects 248 (e.g., pillars, copper pillars, solder balls, etc.). The first substrate 240 includes a plurality of first pads 242, a plurality of first vias 244, and a plurality of first dielectric layers 246 stacked together in layers. The plurality of first pads 242 are coupled to the shield 260. The first substrate 240 may have more or less layers than what is shown.

The modular package 222 includes the device 220 coupled to the second substrate 210. The device 220 may be an integrated circuit (IC) or a passive device. The device 220 is coupled to the second substrate 210 through a plurality of second interconnects 218 (e.g., pillars, copper pillars, solder balls, etc.). The second substrate 210 is over the first substrate 240 and coupled to the first substrate 240 through a plurality of third interconnects 224 (e.g., pillars, copper pillars, solder balls, etc.). The second substrate 210 includes a plurality of second pads 212, a plurality of second vias 214, and a plurality of second dielectric layers 216 stacked together in layers. The second substrate 210 may have more or less layers than what is shown. The plurality of second pads 212 of the second substrate 210 are coupled to the shield 260.

In contrast to FIG. 1C where the plurality of second pads 112 do not couple to the shield, the plurality of second pads 212 of the second substrate 210 are coupled to the shield 262. Accordingly, FIG. 2C illustrates that the modular package 222 achieves the benefit of a shielded-ground connection when the shield 262 is coupled to ground. Moreover, because the plurality of second pads 212 couple to the shield, the mechanical strength of the stacked package apparatus 200 is increased.

Referring back to the illustration of FIG. 2B, the first substrate 240 includes a first side 240a, a second side 240b, and a top side 240c. Moreover, the second substrate 110 includes a first side 210a and a second side 210b. The second substrate 210 is substantially aligned with the first side 240a of the first substrate 240. That is, a portion of the second substrate 210, i.e., the first side 210a of the second substrate 210 overlaps or aligns with the first side 240 of the first substrate 240. Furthermore, the second substrate 210 is substantially aligned with the second side 240b of the first substrate 240. That is, the first side 210a and the second side 210b of the second substrate 210 are flush with the first side 240a and the second side 240b of the second substrate 240 respectively. As used herein, and throughout, the term flush means aligned and/or substantially aligned.

The shield 262 (see FIG. 2C) is coupled to the first side 240a and the second side 240b of the first substrate 240, and to the first side 210a and the second side 210b of the second substrate 210. The main package 250 and the modular package 222 share the shield 262, that is the shared portion of the shield 262a.

It shall be understood that the second substrate 210 may be an interposer, a package substrate, or part of a wafer level package. In one aspect, the device 250 is a flip chip, and the device 222 is an integrated passive device or a surface mounted passive device. In one aspect, the stacked package apparatus 200 may be used in an RF application. In another aspect, the stacked package apparatus 200 may be used as part of a filter device.

The modular package 222 may be fabricated separately (i.e., as a module), including singulated separately before being coupled to the main package 252. Alternatively, the modular package 222 may be fabricated separately, except that it is singulated at the same time that the main package 252 is singulated.

Figure 3:
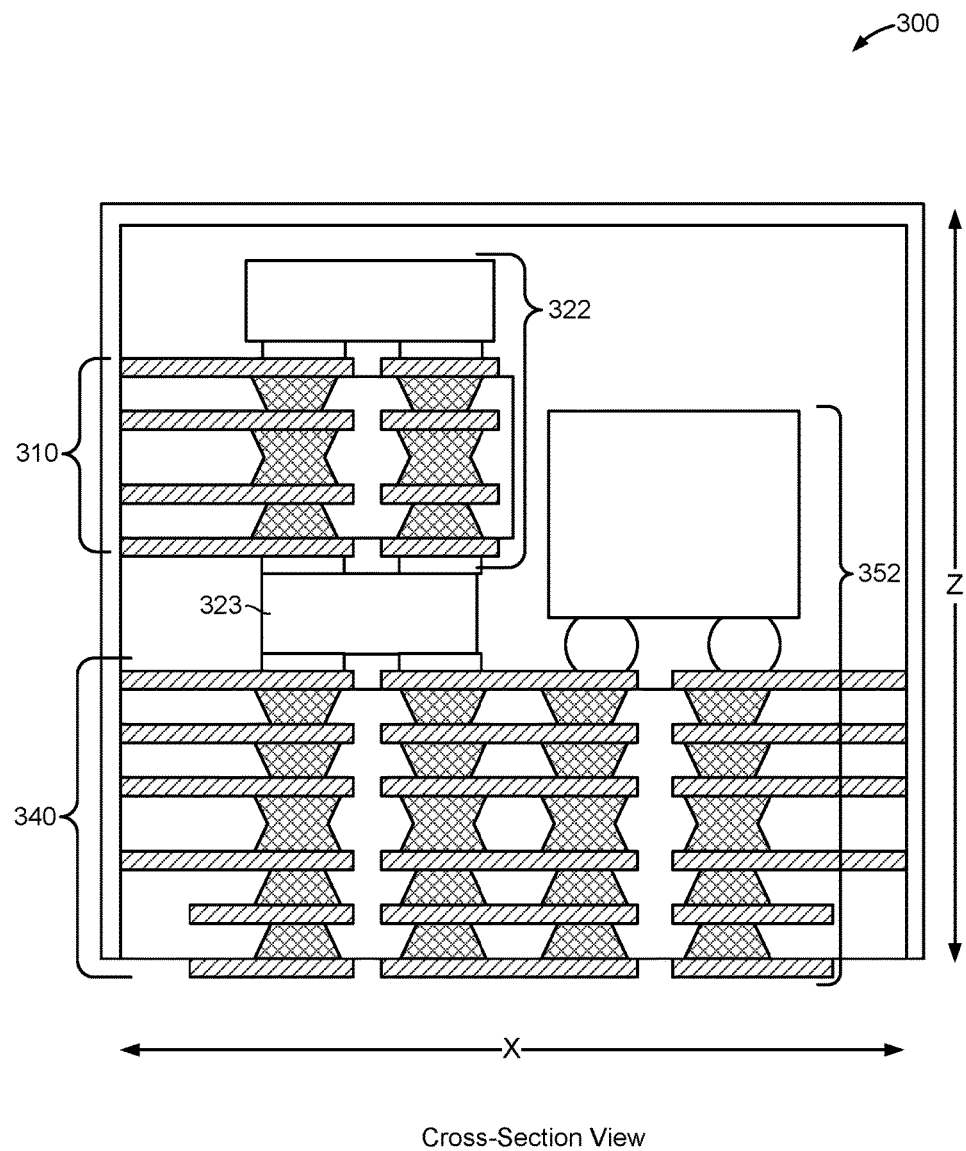
FIG. 3 illustrates a cross section of a stacked substrate apparatus 300.

FIG. 3 illustrates a cross section of a stacked substrate apparatus 300. The stacked substrate apparatus 300 is similar to the stacked substrate apparatus 200 (i.e., after singulation), except that instead of the second substrate 310 (or modular package 322) coupling directly to the first substrate 340 (or main package 352), the second substrate 310 is coupled to device 323. The device 323 may be an integrated circuit or a passive device. The device 323 is coupled to the first substrate 340. In other words, the modular package 322 is coupled to the main package 352 via the device 323. The device 323 may be a device such as an integrated circuit, or a passive device such as a surface mount device.

Exemplary Sequence for Manufacturing Shielded, Stacked Substrates

In some implementations, manufacturing a shielded, stacked substrate includes several sequences. FIG. 4 (which includes FIGS. 4A-4E), FIG. 5 (which includes FIGS. 5A, 5B), and FIG. 6 (which includes FIGS. 6A-6D) illustrates an exemplary sequence for manufacturing shielded, stacked substrates. In some implementations, the sequence of FIGS. 4-6 may be used to manufacture the stacked substrate apparatus of FIG. 2A-C and FIG. 3 and/or other stacked substrate apparatus described in the present disclosure.

FIG. 4A-E illustrate manufacture of a modular package 422. FIG. 5A-B illustrates fabrication of a main package 552. FIG. 6A-D illustrates assembly of a completed stacked package apparatus 600.

Figure 4A:
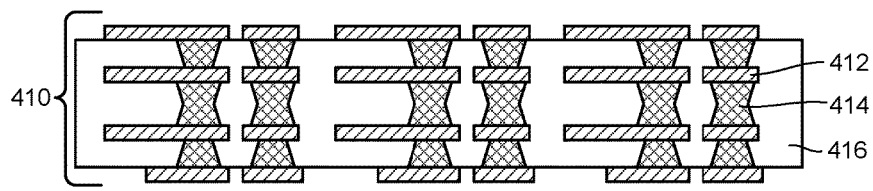
FIG. 4 (which includes FIGS. 4A-4E) illustrates an exemplary sequence for manufacturing a modular package.
Figure 5A:
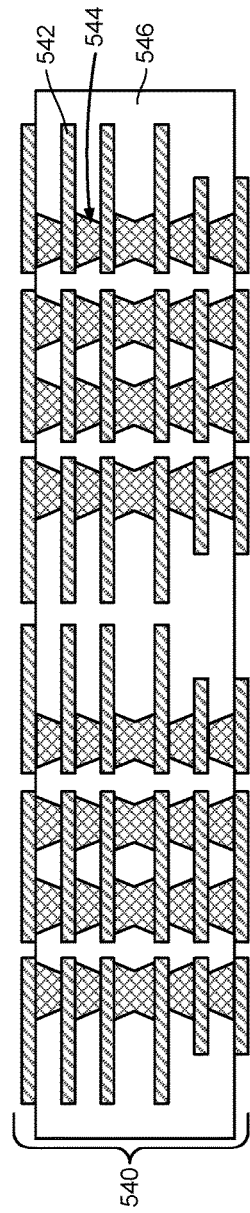
FIG. 5 (which includes FIGS. 5A and 5B) illustrates an exemplary sequence for manufacturing a main package.
Figure 5B:
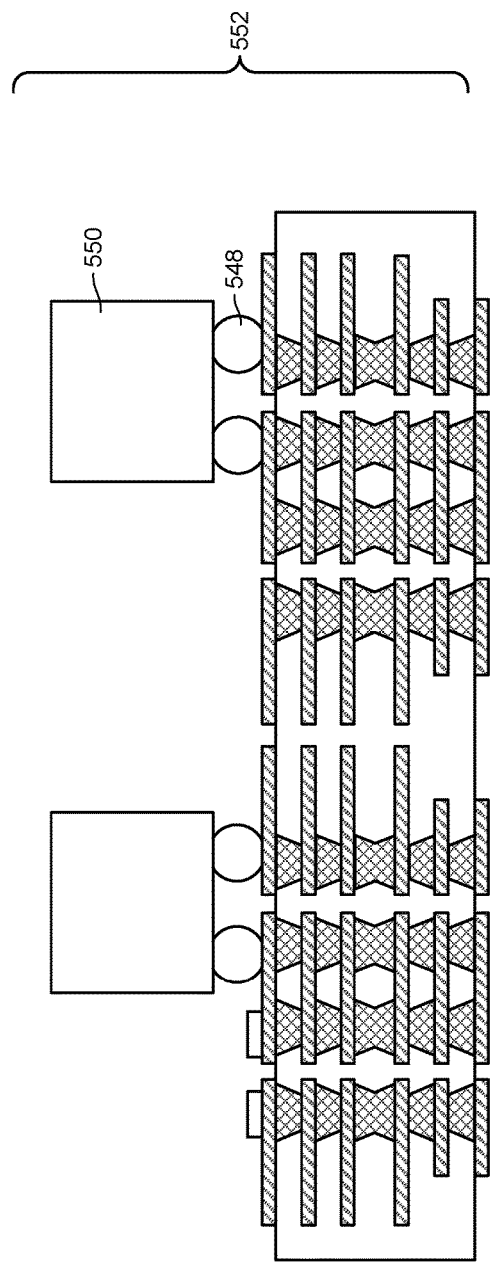

FIG. 4A illustrates a second substrate 410. The second substrate 410 includes a plurality of second pads 412, a plurality of second vias 414, and a plurality of second dielectric layers 416 stacked together in layers. The second substrate 410 may have more or less layers than what is shown. The second substrate 410 may be an interposer, a package substrate, or part of a wafer level package.

Figure 4B:
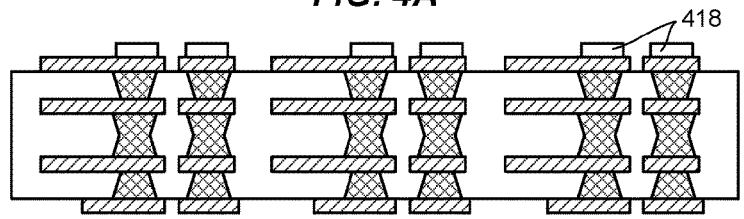

FIG. 4B illustrates the second substrate 410 after a stencil 418 has been applied. The stencil 418 is configured for coupling the second substrate 410 to a device, however, other methods may be used.

Figure 4C:
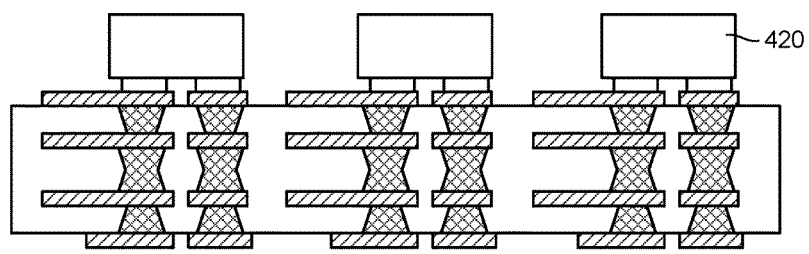

FIG. 4C illustrates the second substrate 410 after a device 420 has been coupled to the second substrate with solder 418. The device 420 may be a passive device, such as a surface mounted device, or may be an integrated circuit. The device 420 may be an integrated circuit or passive device.

Figure 4D:
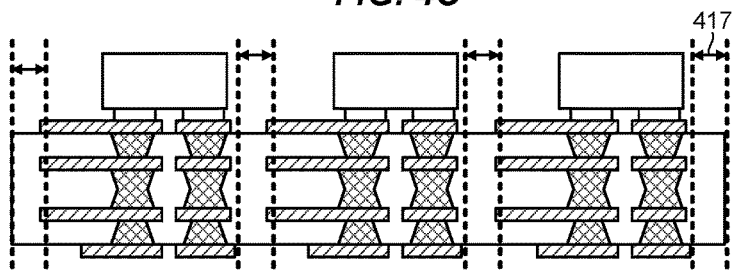

FIG. 4D illustrates singulation of the second substrate 410 at an area 417.

Figure 4E:
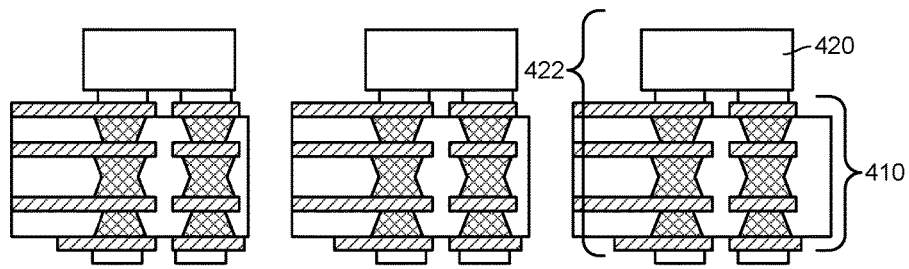

FIG. 4E illustrates the modular package 422, including the second substrate 410 coupled to the device 420. The modular package 422 is ready for assembly with the main package (not yet shown).

FIG. 5A illustrates a first substrate 540. The first substrate 540 includes a plurality of first pads 542, a plurality of first vias 544, and a plurality of first dielectric layers 546 stacked together in layers. The first substrate 540 may have more or less layers than what is shown. The first substrate 540 may be an interposer, a package substrate, or part of a wafer level package.

FIG. 5B illustrates the main package 552 including a device 550 coupled to the first substrate 540. An interconnect 548 couples the first substrate 540 to the device 550. The device 550 may be an integrated circuit. There may be more than one device coupled to the first substrate 540.

FIG. 6A illustrates the modular package 422 coupled to the main package 540, through an interconnect 624. That is the second substrate 410 is coupled to the first substrate through the interconnect 624.

FIG. 6B illustrates a mold 660 is applied over the modular package 422 and over the main package. The mold 660 may also be applied under the devices 522 and 550 and under and in-between the interconnects 624.

Figure 6C:
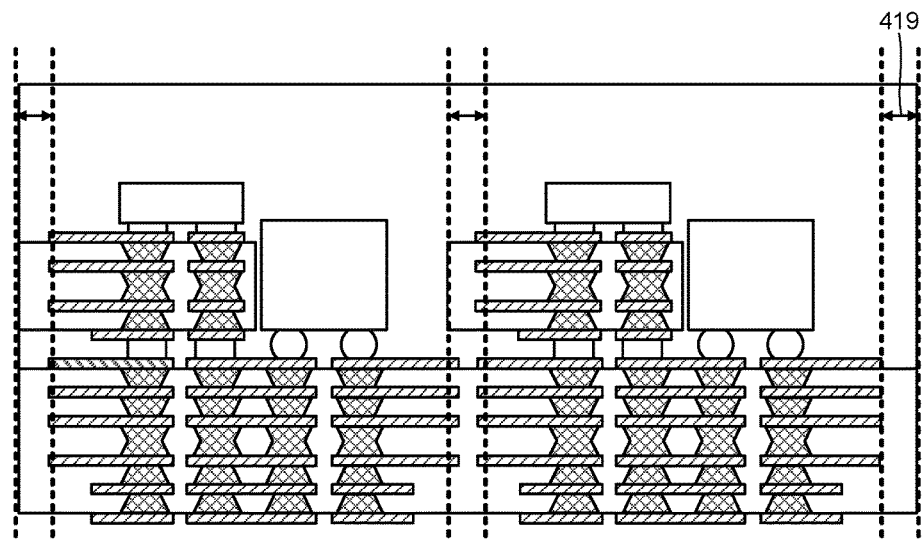
FIG. 6 (which includes FIGS. 6A-D) illustrates assembly of the completed stacked package apparatus 600.

FIG. 6C illustrates singulation of the first substrate 540 and the second substrate 410 at an area 419.

Figure 6D:
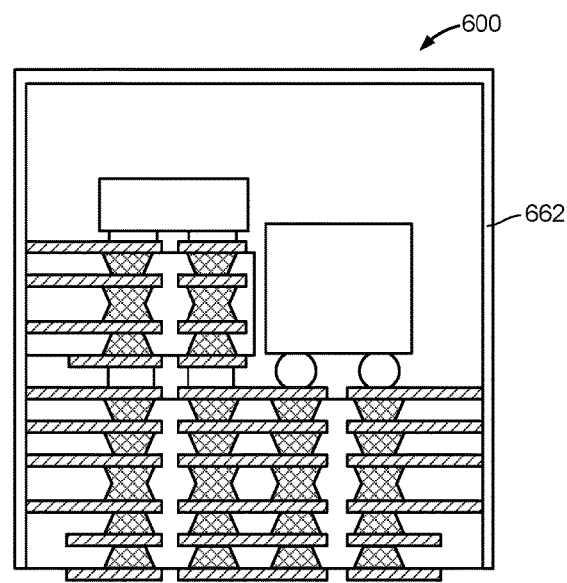

FIG. 6D illustrates the completed stacked substrate apparatus 600. A shield is applied over the mold 660, the shield surrounds the mold and the modular package 422 and the main package 552. The shield 660 is coupled to the plurality of second pads 412 and a plurality of first pads 542.

Figure 7:
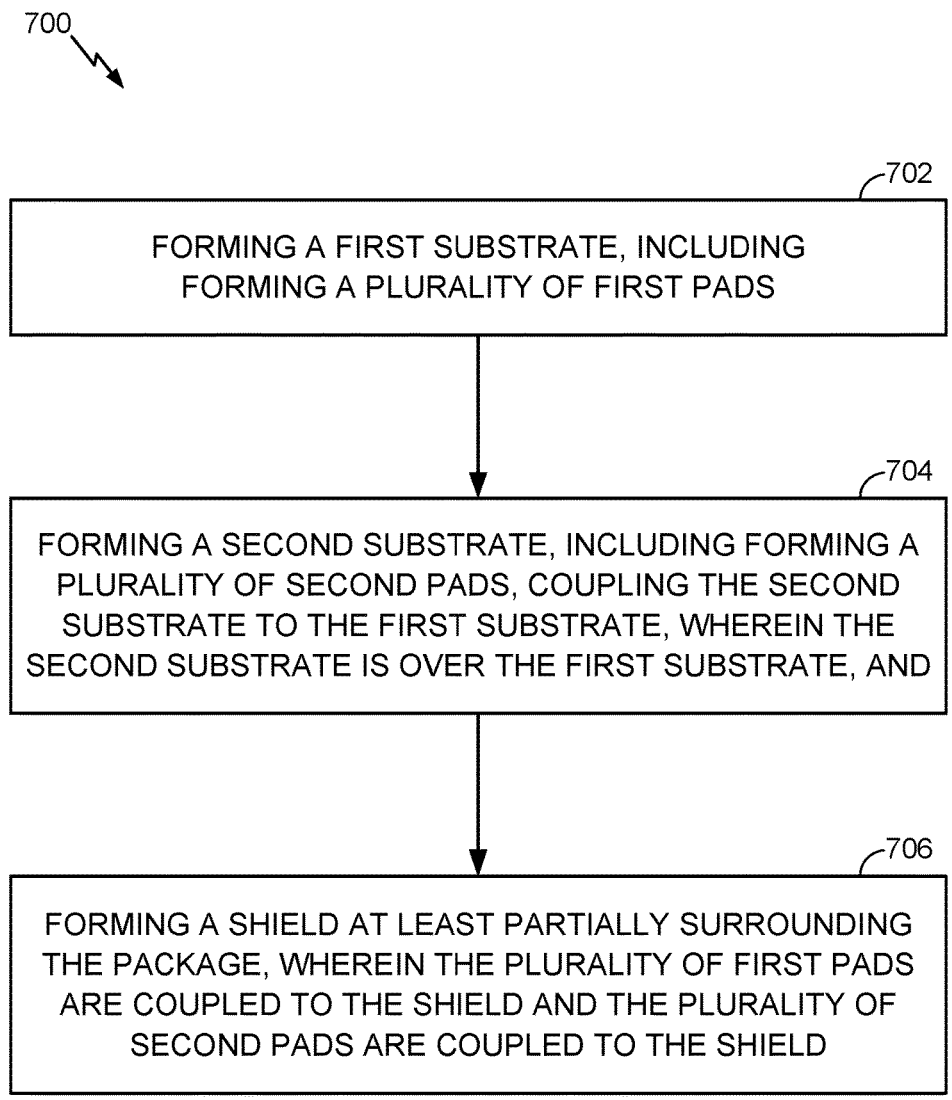
FIG. 7 illustrates an exemplary flow diagram of a high-level method for manufacturing a stacked package apparatus.

Exemplary Flow Diagram of a Method for Manufacturing Perpendicular Inductors Integrated in a Substrate FIG. 7 illustrates an exemplary flow diagram of a method 700 for manufacturing a stacked package apparatus. It should be noted that for the purpose of clarity and simplification, the flow diagram of FIG. 7 does not necessarily include all the steps of manufacturing. Moreover, in some instances, several steps may have been combined into a single step to simplify the description of the sequences.

The method includes forming a first substrate, including forming a plurality of first pads at block 702. Next, the method includes forming a second substrate, including forming a plurality of second pads, coupling the second substrate to the first substrate, wherein the second substrate is over the first substrate is performed at block 704. The method further includes forming a shield at least partially surrounding the package, wherein the plurality of first pads are coupled to the shield and the plurality of second pads are coupled to the shield is performed at block 706.

Exemplary Electronic Devices

Figure 8:
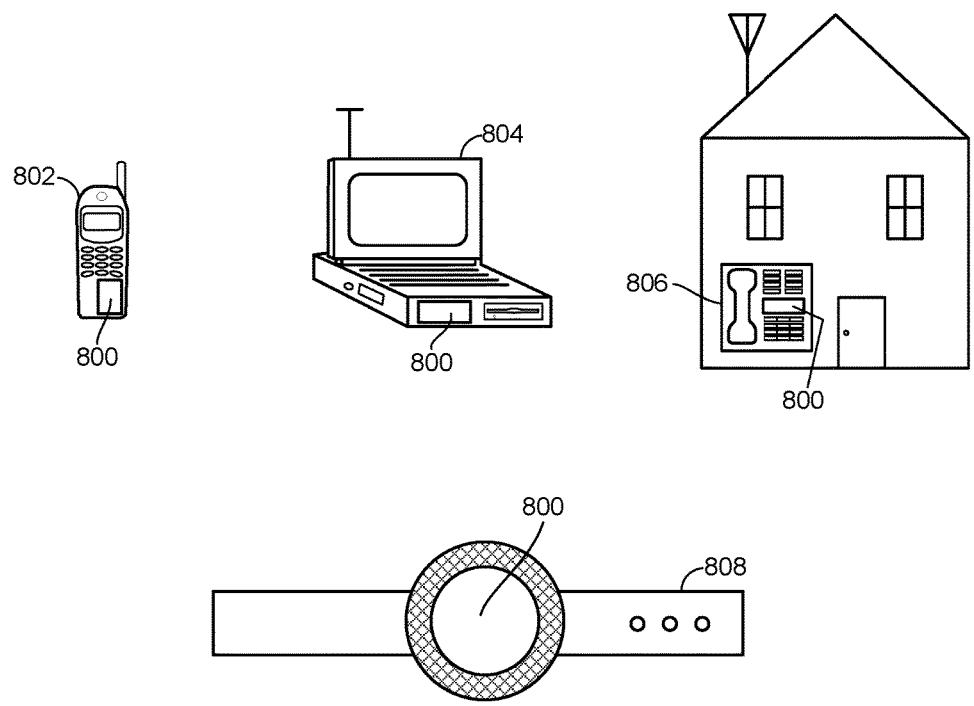
FIG. 8 illustrates various electronic devices that may include the various substrates, integrated devices, integrated device packages, semiconductor devices, dies, integrated circuits, and/or packages described herein.

FIG. 8 illustrates various electronic devices that may be integrated with any of the aforementioned substrate, integrated device, semiconductor device, integrated circuit, die, interposer, or package. For example, a mobile phone device 802, a laptop computer device 804, a fixed location terminal device 806, a wearable device 808 may include an integrated device 800 as described herein. The integrated device 800 may be, for example, any of the substrate, integrated circuits, dies, integrated devices, integrated device packages, integrated circuit devices, device packages, integrated circuit (IC) packages, package-on-package devices described herein. The devices 802, 804, 806, 808 illustrated in FIG. 8 are merely exemplary. Other electronic devices may also feature the integrated device 800 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watch, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2A-C, 3, 4, 5, 6, and/or 7 may be rearranged and/or combined into a single component, process, feature or function or embodied in several components, processes, or functions. Additional elements, components, processes, and/or functions may also be added without departing from the disclosure. It should also be noted that FIGS. 2A-C through 6, and/or 7 and its corresponding description in the present disclosure is not limited to substrates. In some implementations, FIGS. 2A-C through 6, and/or 7 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "traverse" as used herein, means to go across and includes going all the way across an object or partially across an object.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An apparatus comprising:
   a shield;
   a first package including a first device coupled to a first substrate and a plurality of first pads, the plurality of first pads coupled to the shield;
   a second package including a second device coupled to a second substrate, the second substrate located over the first substrate and coupled to the first substrate, and a plurality of second pads, the plurality of second pads coupled to the shield; and
   a mold located over the first package and the second package, wherein the shield is located over the mold, the first package, and the second package, and the shield surrounds the first package and the second package.

2. The apparatus of claim 1, wherein the first substrate includes a first side, wherein the second substrate is substantially aligned with the first side of the first substrate.

3. The apparatus of claim 2, wherein the first substrate includes a second side, and the second substrate is substantially aligned with the second side of the first substrate.

4. The apparatus of claim 3, wherein the second substrate has a first side and a second side, wherein the first side of the second substrate is aligned with the first side of the first substrate, and the second side of the second substrate is aligned with the second side of the first substrate.

5. The apparatus of claim 3, wherein the shield is coupled to the first side of the first substrate and to the first side of the second substrate.

6. The apparatus of claim 5, wherein the shield is coupled to the second side of the first substrate and to the second side of the second substrate.

7. The apparatus of claim 3, wherein the first device is an integrated circuit, and wherein the second device is a passive device.

8. The apparatus of claim 7, wherein the mold is located within the shield.

9. The apparatus of claim 1 wherein, further comprising:
the first package is a main package, and the first device is a first integrated circuit or a first passive device;
the second package is a modular package, and the second device is a second integrated circuit or a second passive device, and
the main package and the modular package share the shield.

10. The apparatus of claim 9, wherein the shield includes a shared portion, the shared portion of the shield is located on a first side of the apparatus, and the first substrate and the second substrate are coupled to the shared portion of the shield.

11. The apparatus of claim 10 further comprising:
a third device that is either a third integrated circuit or third passive device, wherein the modular package is coupled to the main package via the third device.

12. The apparatus of claim 11, wherein a first side and a second side of the second substrate are aligned with the first side and the second side of the first substrate, and the first substrate and the second substrate share a shield located on the first side and the second side of the first substrate and on the first side and the second side of the second substrate.

13. The apparatus of claim 1, wherein the apparatus is incorporated into a device selected from a group consisting of a music player, a video player, an entertainment unit, a navigation device, a communications device, a mobile device, a mobile phone, a smart phone, a personal digital assistant, a fixed location terminal or server, a tablet computer, a wearable computing device, and a laptop computer.

* * * * *